United States Patent [19]

Orndorff

[11] Patent Number: 5,640,697

[45] Date of Patent: Jun. 17, 1997

[54] WIDEBAND MULTIPLE CONVERSION RECEIVER SYSTEM WITH MEANS FOR AVOIDING RECEIVER SPURS BY COMBINED SWITCHING OF MULTIPLE LOCAL OSCILLATOR FREQUENCIES

[75] Inventor: Dennis Lee Orndorff, Greenfield, Ind.

[73] Assignee: Trilithic, Inc., Indianapolis, Ind.

[21] Appl. No.: 477,488

[22] Filed: Jun. 7, 1995

Related U.S. Application Data

[62] Division of Ser. No. 74,888, Jun. 10, 1993, Pat. No. 5,493, 210.

[51] Int. Cl.$^6$ ........................................... H04B 1/26
[52] U.S. Cl. ................ 455/315; 455/136.1; 455/255; 455/296; 455/310; 455/314; 455/317; 331/2; 331/46
[58] Field of Search ...................... 455/296, 266, 455/310, 313, 314, 315, 317, 209, 255, 189.1, 136.1, 316, 183.1, 183.2, 185.1, 62, 207, 208, 311; 33/2, 46

[56] References Cited

U.S. PATENT DOCUMENTS

| | | |
|---|---|---|
| 3,372,339 | 3/1968 | Harrison et al. . |
| 3,414,821 | 12/1968 | Bickers et al. . |
| 3,908,165 | 9/1975 | Cauldwell . |
| 4,063,173 | 12/1977 | Nelson et al. . |
| 4,072,899 | 2/1978 | Shimp . |
| 4,152,669 | 5/1979 | Igarashi . |
| 4,198,604 | 4/1980 | Holdaway . |
| 4,322,856 | 3/1982 | Ohta et al. . |
| 4,340,974 | 7/1982 | Cooke et al. . |
| 4,395,777 | 7/1983 | Oki et al. . |
| 4,491,968 | 1/1985 | Shimp et al. . |
| 4,512,035 | 4/1985 | Victor et al. . |
| 4,545,072 | 10/1985 | Skutta et al. ............................ 455/315 |
| 4,570,117 | 2/1986 | Holt . |
| 4,578,820 | 3/1986 | Highton . |
| 4,661,995 | 4/1987 | Kashiwagi ............................ 455/315 |
| 4,685,065 | 8/1987 | Braun et al. . |
| 4,710,969 | 12/1987 | Fluck, Jr. et al. . |
| 5,057,848 | 10/1991 | Rankin et al. . |
| 5,230,094 | 7/1993 | Kitching et al. ........................ 455/296 |

FOREIGN PATENT DOCUMENTS

| | | |
|---|---|---|
| 60-48625 | 3/1985 | Japan ..................... 455/315 |
| 0153230 | 8/1985 | Japan ..................... 455/255 |
| 0120733 | 1/1989 | Japan ..................... 455/296 |

OTHER PUBLICATIONS

Trilithic product announcement, Communications Technology, Jun. 1992, 1 page.
Trilithic product announcement, CED, Jun. 1992, 1 page.
Trilithic Searcher Plus™ Operation and Application Manual, Manual P/N 001-120-00, c. 1989, Title page and pp. 1-26.
Comsonics, Inc. product literature on Window II™, 2 pages (undated).
Comsonics, Inc. product literature on Window™LitePlus and Modularity, ©1992, 8 pages.
Wavetek product literature on LineSam II™, ©1993, 4 pages.
CaLan™product literature on Star Signal Level Measurement System, printed Dec. 1, 1992, 5 pages.

*Primary Examiner*—Reinhard J. Eisenzopf
*Assistant Examiner*—Doris To
*Attorney, Agent, or Firm*—Woodard, Emhardt, Naughton, Moriarty & McNett

[57] ABSTRACT

A multiple conversion receiver system capable of avoiding receiver spurs by combined switching of multiple local oscillator frequencies, including combinations of high-side and low-side injection and IF shifting.

24 Claims, 16 Drawing Sheets

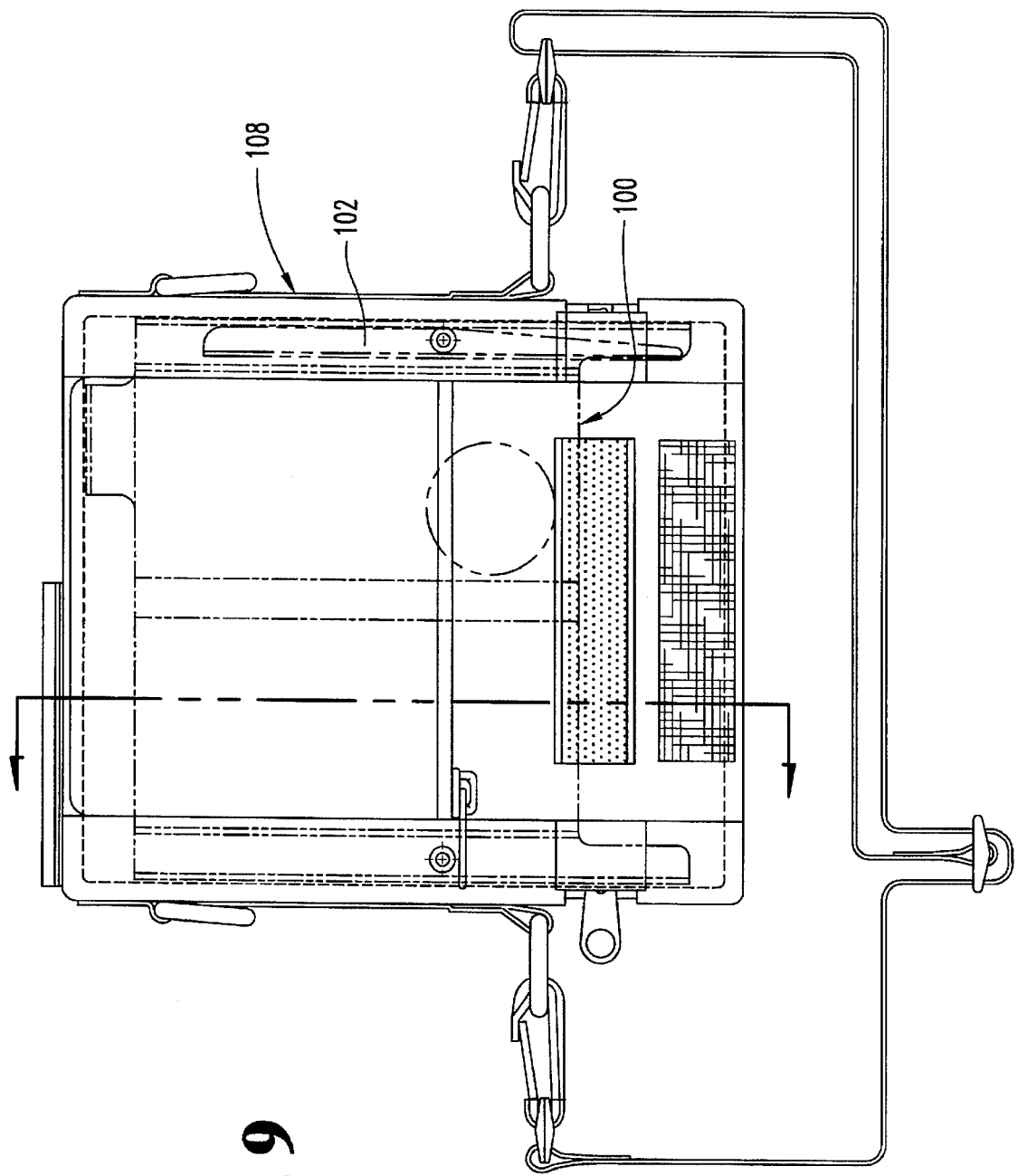

WIDEBAND MULTIPLE CONVERSION RECEIVER SYSTEM WITH MEANS FOR AVOIDING RECEIVER SPURS BY COMBINED SWITCHING OF MULTIPLE LOCAL OSCILLATOR FREQUENCIES

CROSS-REFERENCE TO RELATED APPLICATION

This application is a divisional of application Ser. No. 08/074,888, filed Jun. 10, 1993 now U.S. Pat. No. 5,493,210.

BACKGROUND OF THE INVENTION

This invention relates to RF test instruments and, more particularly, to signal level meters and leakage detectors of the type used, for example, in cable television systems. There is a need for a broad frequency range in RF test instruments, particularly those for use in the CATV industry. However, designers of such instruments must contend with a significant problem in maintaining adequate local oscillator isolation in a broadband RF front end while using low-cost printed circuit board designs and simple automated assembly processes. To prevent spurious responses, commonly known as spurs, due to harmonic mixing of the local oscillators, isolation on the order of 100 dB is required. Unfortunately, this degree of isolation is impractical at reasonable cost.

Receiver spurs occur when the first local oscillator and the second local oscillator and/or their harmonics combine in the first or second mixer and produce an output that falls within the third IF bandwidth. Traditionally, spurs are reduced to an acceptable level or eliminated by providing better isolation between the first and second local oscillators and mixers. In wideband receivers, providing this isolation leads to costly packaging, shielding, and filtering.

Many spurs in a receiver can be eliminated by switching the second local oscillator frequency for high or low side mixing as the receiver is tuned. U.S. Pat. No. 4,512,035 to Victor et al. provides one example of a receiver capable of avoiding receiver self-quieting spurious responses by selectively providing either high-side or low-side injection to the second mixer. For receivers with narrow enough IF bandwidths, this can eliminate all spurs in the third IF. In signal level meters, a large spur that falls outside the third IF bandwidth but inside the second IF bandwidth can desensitize the second or third amplifier, or the third mixer. This will cause inaccurate signal level readings for receive frequencies relatively near to the spur frequency. Switching the second local oscillator frequency alone will not eliminate this type of spur problem.

Thus, there remains a need for improvement in the elimination of receiver spurs.

SUMMARY OF THE INVENTION

The present invention overcomes these and other disadvantages of the prior art by providing a multiple conversion receiving system capable of avoiding receiver spurs by combined switching of multiple local oscillator frequencies. The system includes a means for selecting an alternative frequency for a first IF signal and for correspondingly changing the frequencies of first and second local oscillators, as well as a means for switching the frequency of the second local oscillator between a low-side injection frequency and a high-side injection frequency.

These and other objects of the invention will become more apparent upon reading the following detailed description in conjunction with the accompanying drawings.

BRIEF DESCRIPTION OF THE DRAWINGS

FIG. 9 is an illustration of a snap-in bag including a metal bracket or mount adapted to receive the meter case.

DESCRIPTION OF THE PREFERRED EMBODIMENT

Figure 1:
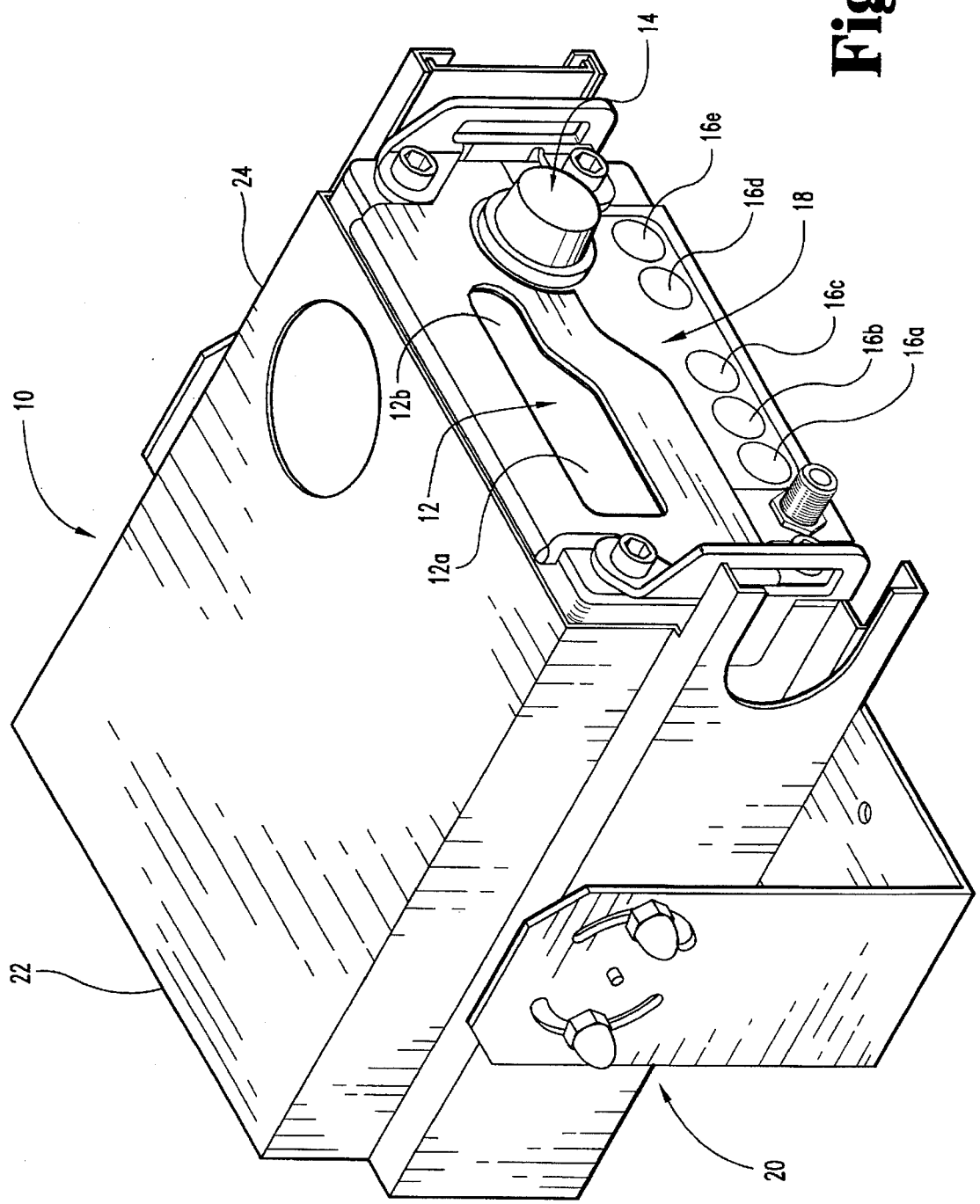
FIG. 1 is a perspective view of a combined signal level meter and leakage detector according to the preferred embodiment of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

With reference to FIG. 1, the preferred embodiment of the present invention combines a signal level meter and a leakage detector along with a data logger into one convenient handheld unit 10 having a dual-function LED display 12, a multi-function spin knob 14 and five momentary switches or function keys 16a, b, c, d and e arranged on the front panel 18 as shown in the drawing. The switch functions are generally described as follows:

| Switch (label) | Function |
| --- | --- |
| 16a (ON/OFF) | Turns unit and/or display backlighting on or off |
| 16b (SLM/LEAK) | Toggles the meter between signal level meter (SLM) and leakage (LEAK) detection modes |
| 16c (CH/FREQ) | Toggles the meter between channel (CH) and frequency (FREQ) tuning modes |
| 16d (FUNC) | Function menu access |
| 16e (MEM) | Memory access -- activates internal memory feature for storing and retrieving ten channel setups |

Figure 2A:
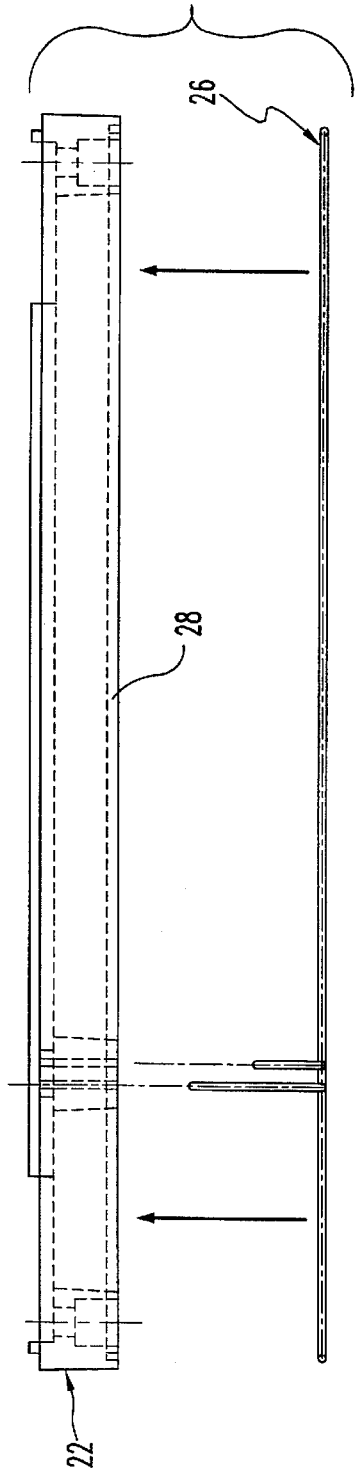
FIGS. 2A and 2B are drawings of the rear bezel, with built-in antenna, for the meter of FIG. 1.
Figure 2B:
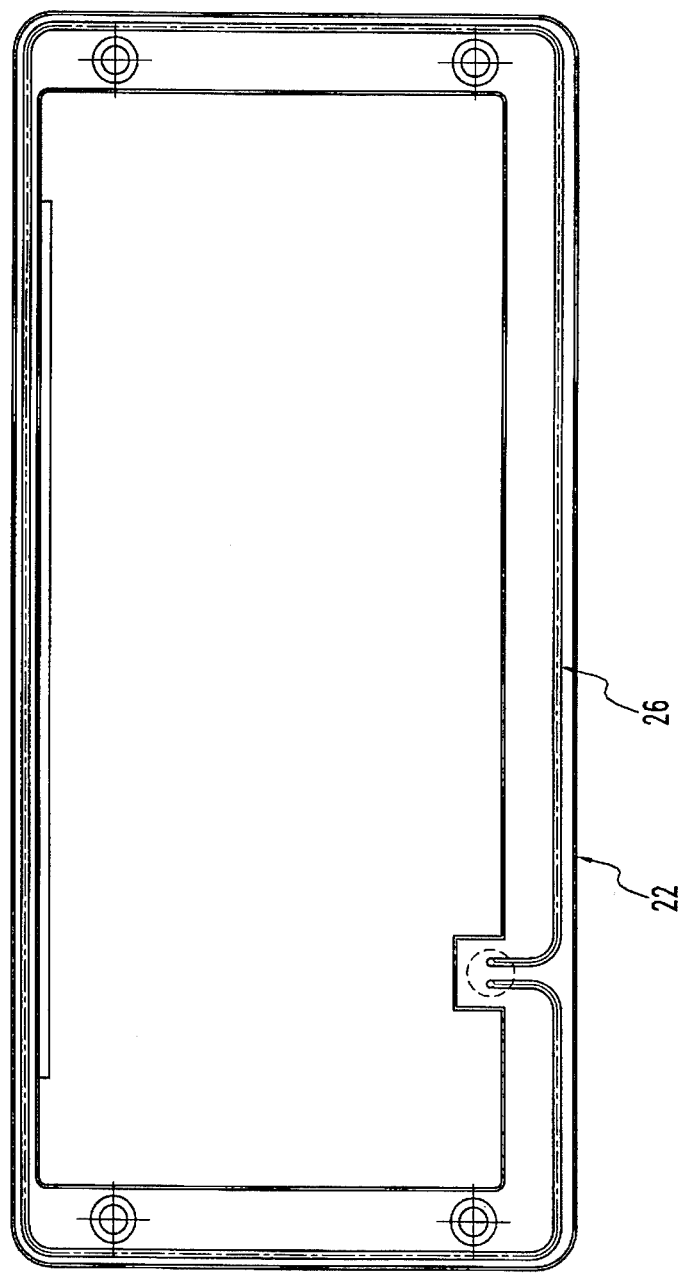

The meter is adapted for vehicle mounting and unit 10 is shown in the vehicle mount 20 in FIG. 1. The meter is also adapted for snap-in mounting in a protective case for handheld use, as will be further described later. The rear bezel 22 of the meter case 24 has a built-in loop antenna 26 for the leakage detector as shown in FIGS. 2A and 2B, which are, respectively, the top view and rear view of the bezel. Suitable dimensions for the antenna are approximately 5½ inches long and 2¼ inches wide. The antenna is placed in a slot 28 of the rear bezel and held in place with potting compound.

Figure 3:
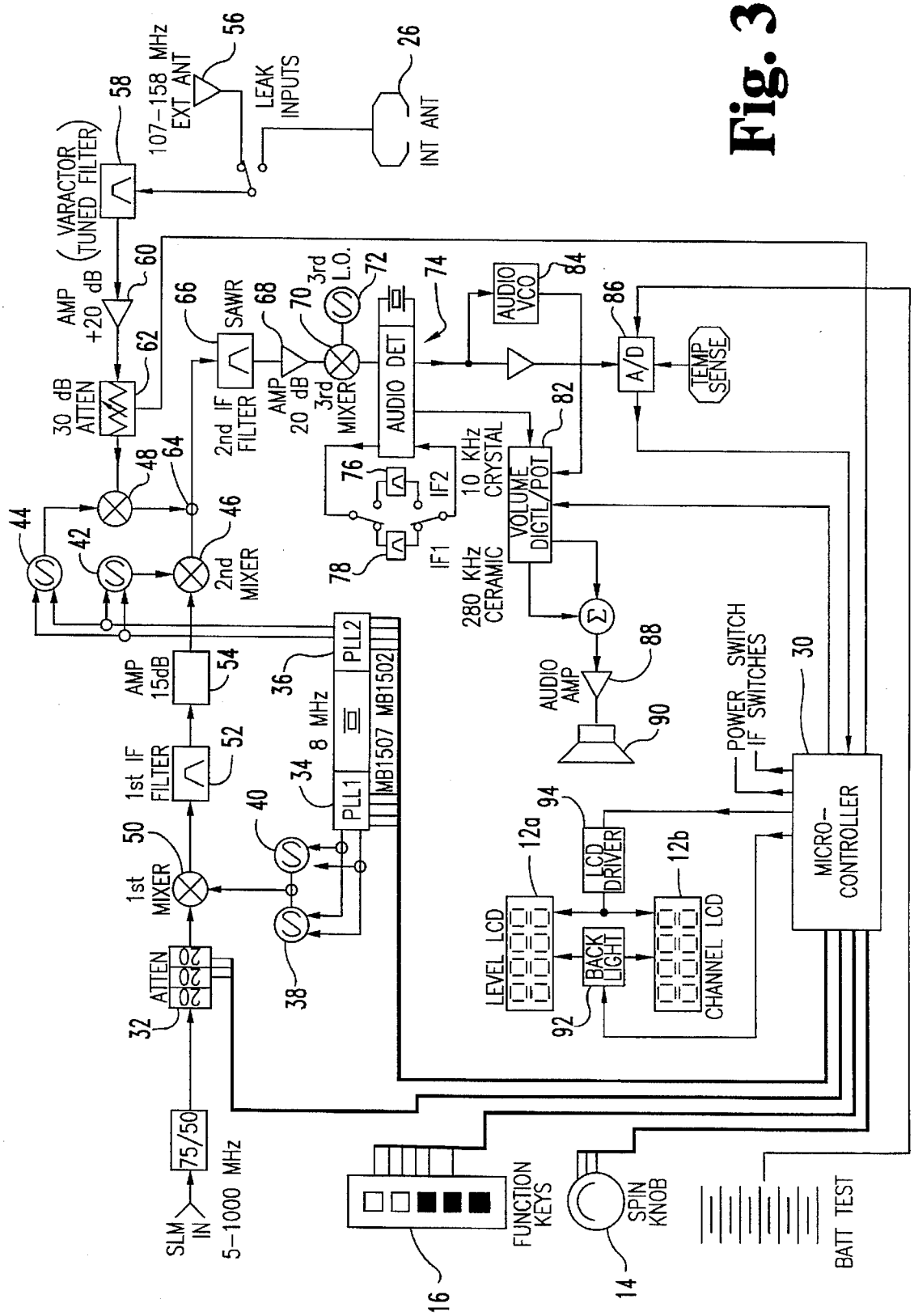
FIG. 3 is a block diagram of the circuitry in the meter of FIG. 1.
Figure 4A:
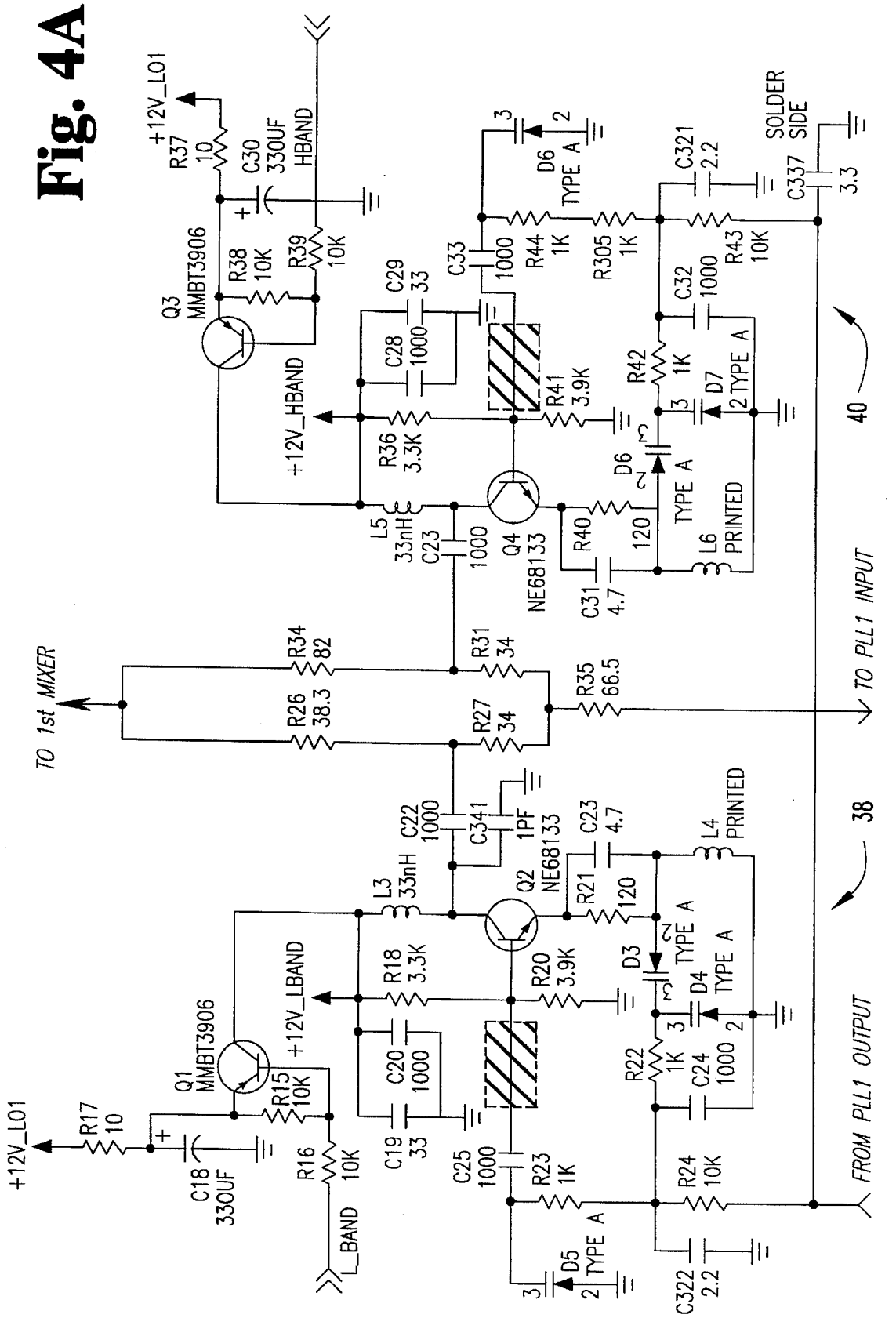
FIGS. 4A, 4B, 4C, 4D, 4E and 4F are electrical schematics of portions of the receiver circuitry for the meter of FIG. 1, including first and second IF stages along with associated local oscillators and mixer circuitry.
Figure 4B:
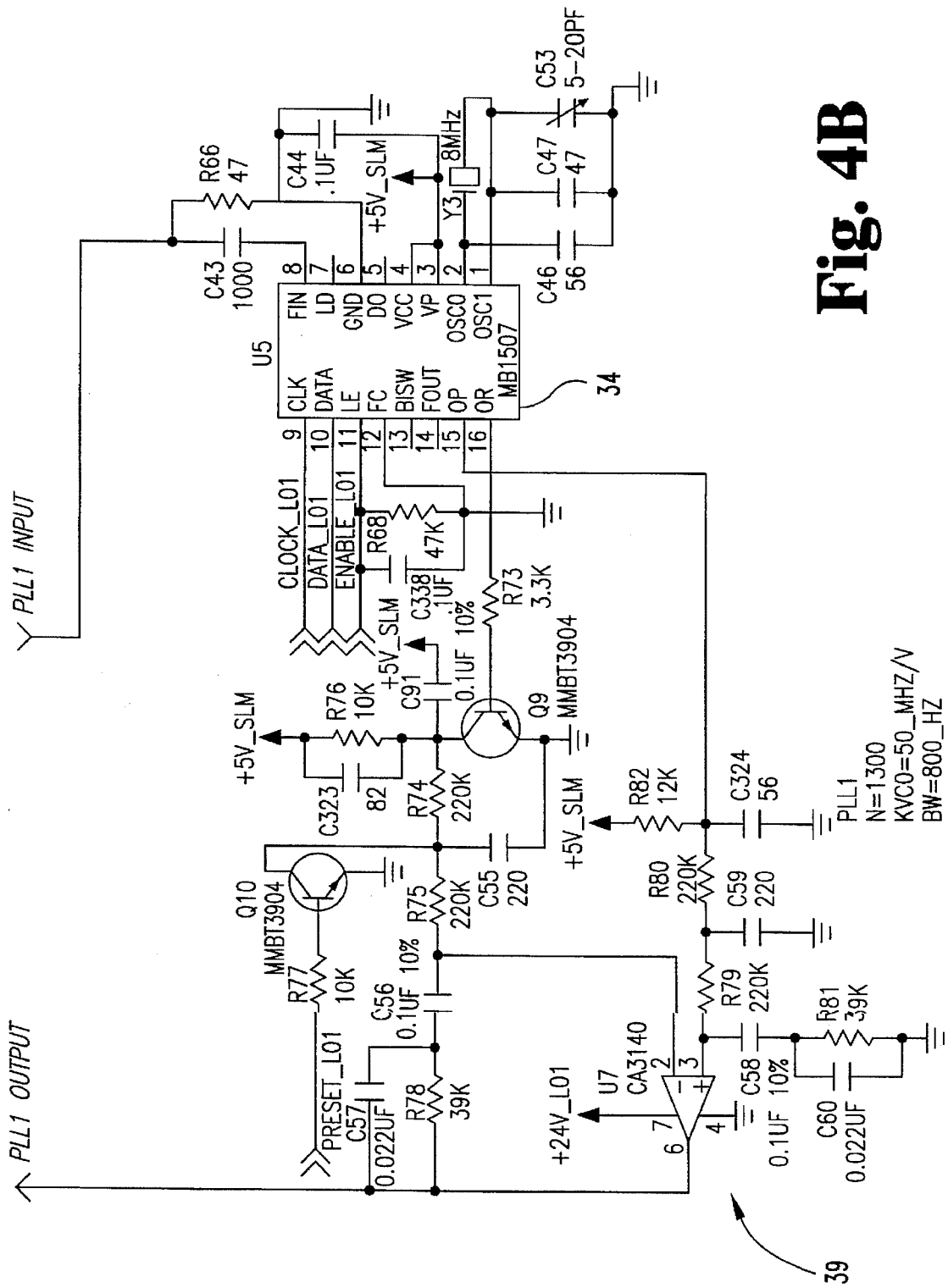

FIG. 3 illustrates the meter circuitry in block diagram form. The above-described function keys 16 and spin knob 14 provide inputs to a microcontroller 30 which, among other things as will be described, provides control signals to a three-stage attenuator (ATTEN) 32 and first and second local oscillator phased-lock loop ICs 34 and 36 (PLL1 and PLL2). The MB1507 and MB1502PF ICs are available from Fujitsu. The three-stage attenuator preferably provides 20 dB of attenuation in each stage, and each stage is designed around a Takamisawa UR1LD5WK5V latching relay arranged to selectively switch an attenuator pad into or out of the signal path. The first local oscillator includes a low-band oscillator 38 and a high-band oscillator 40 connected to the PLL IC and associated loop filter in a conventional manner. FIGS. 4A and 4B show the first local oscillator circuitry in detail, including the L BAND and H BAND control lines from the microcontroller for band switching: oscillator 38 is enabled when the meter is to be tuned to frequencies in the range of 5 to 700 MHz, designated the L band, and oscillator 40 is enabled when the meter is to be tuned to frequencies in the range of 700 to 1000 MHz, designated the H band.

Figure 4C:
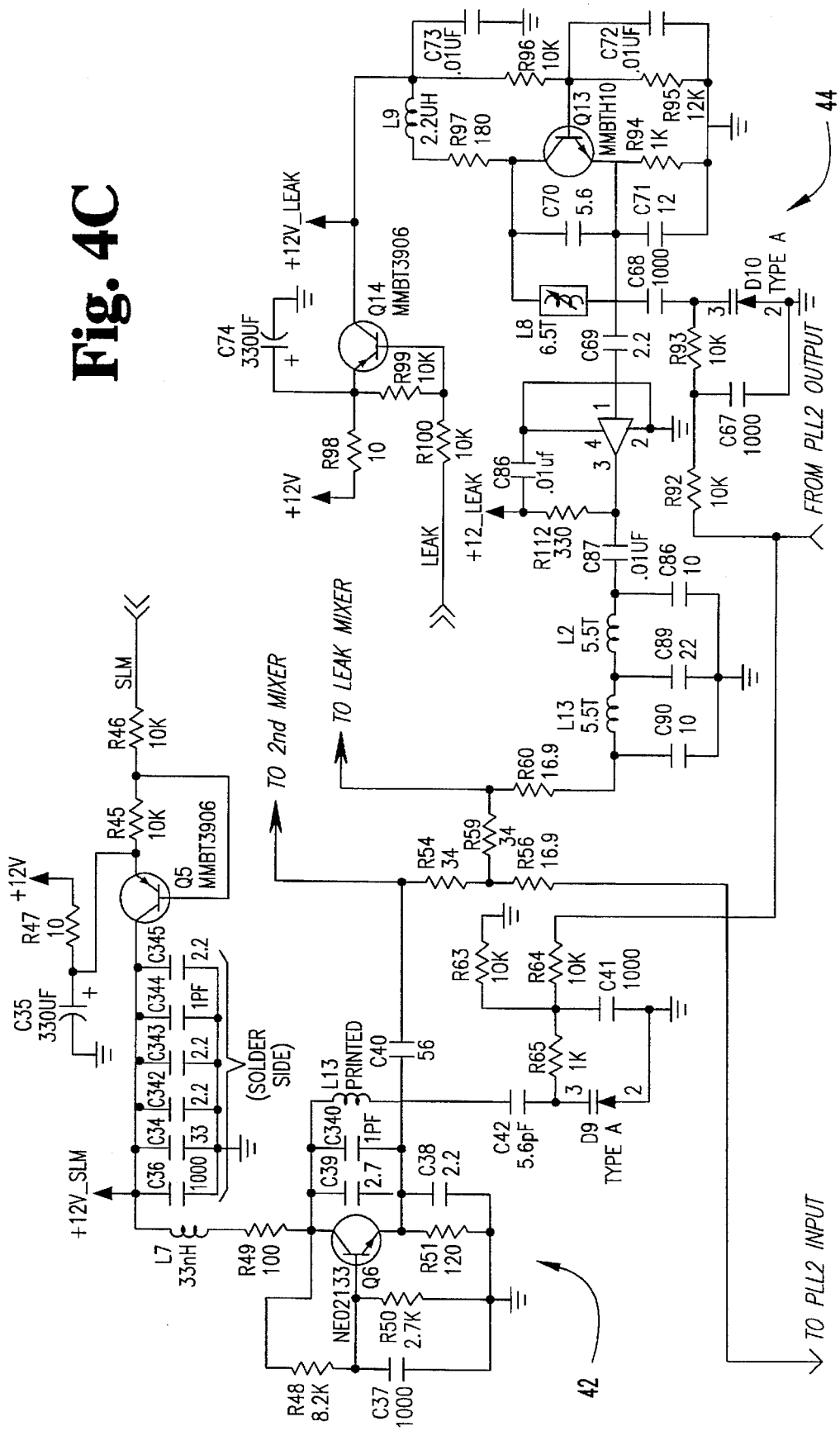
Figure 4D:
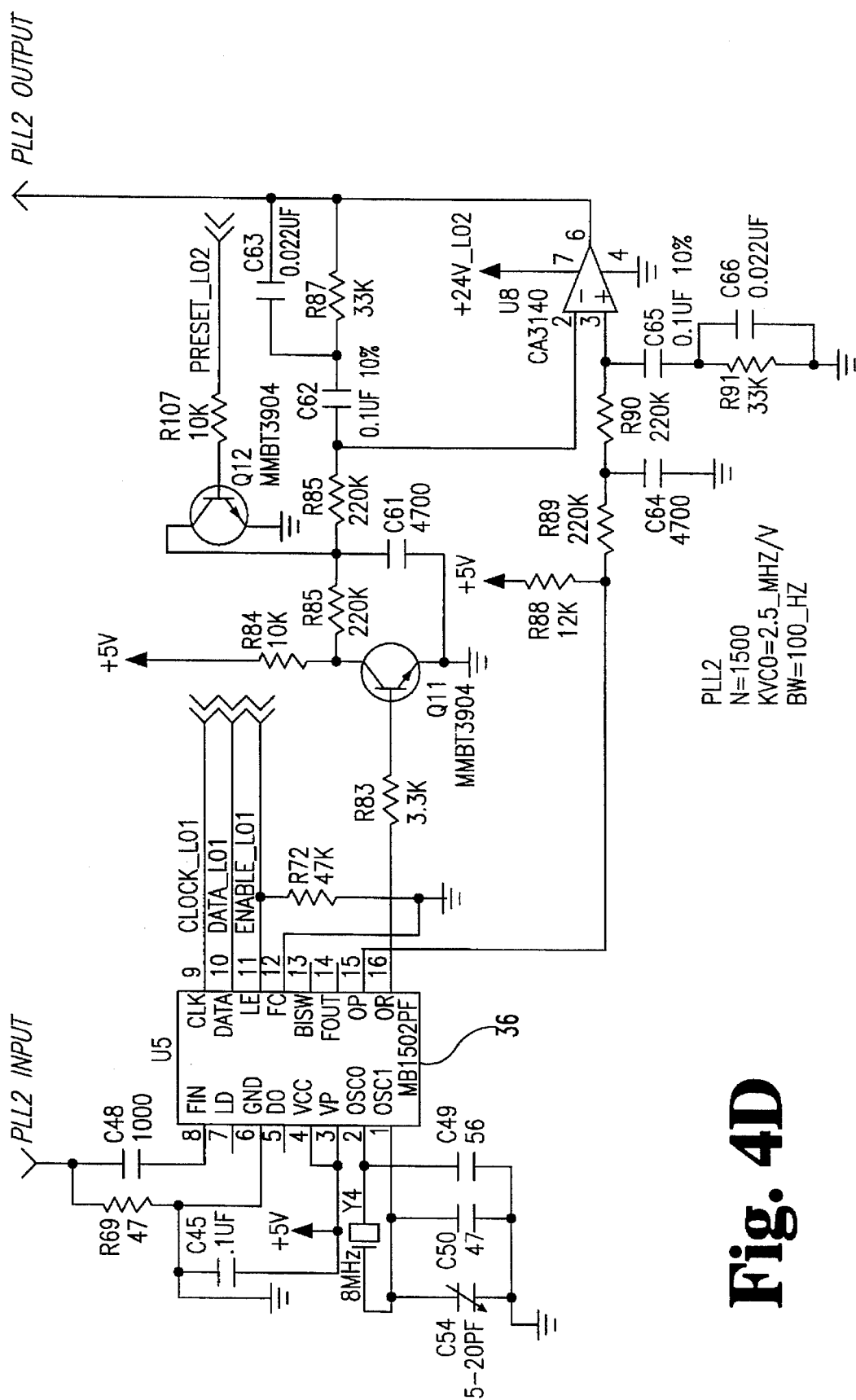

Similarly, the second local oscillator includes an oscillator 42 operable during SLM mode and an oscillator 44 operable during leakage mode, these oscillators being connected to mixer 46 and mixer 48, respectively. FIGS. 4C and 4D show the second local oscillator in detail, including the SLM and LEAK inputs for control signals from the microcontroller to enable a selected oscillator.

Figure 4E:
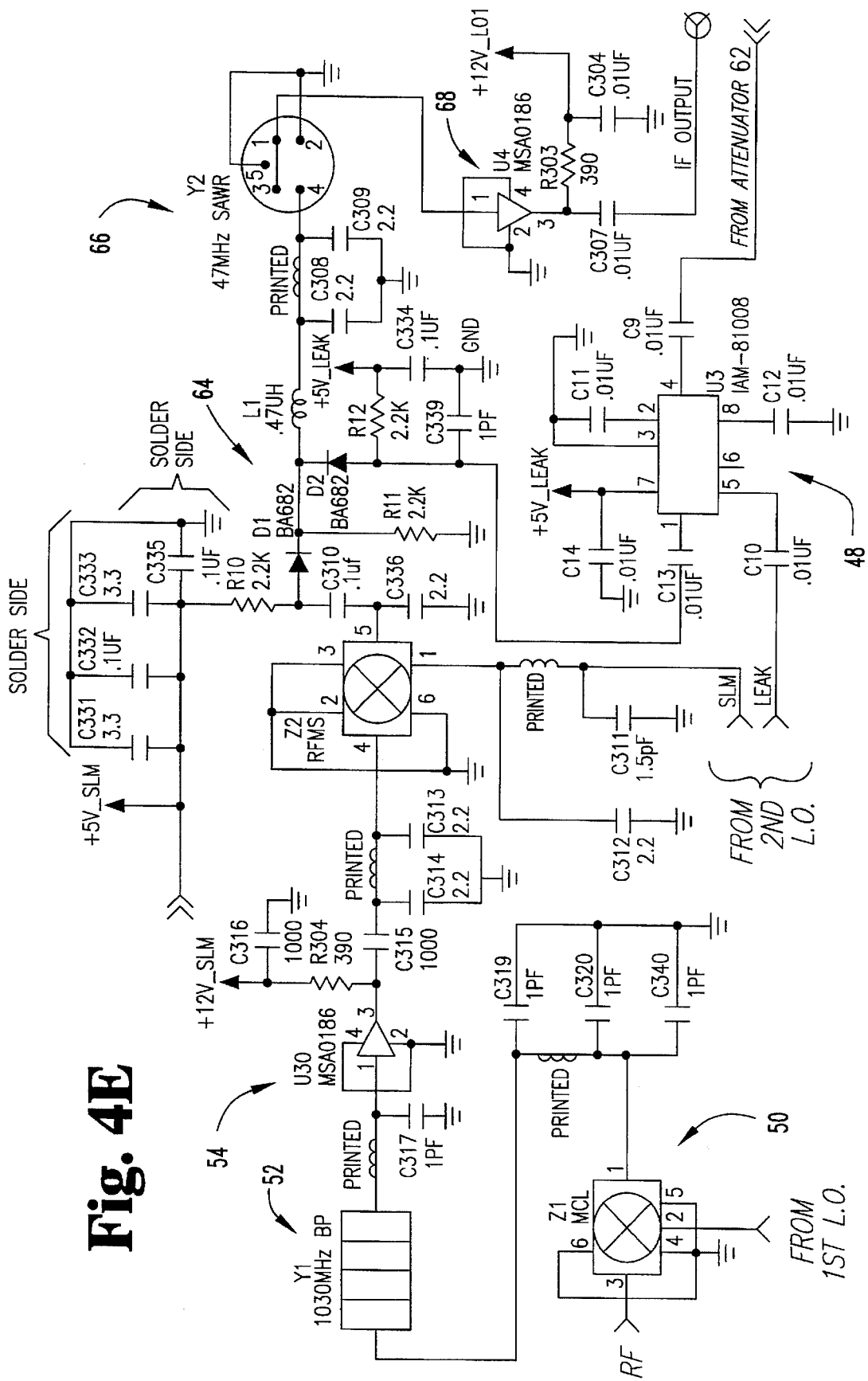
Figure 8:
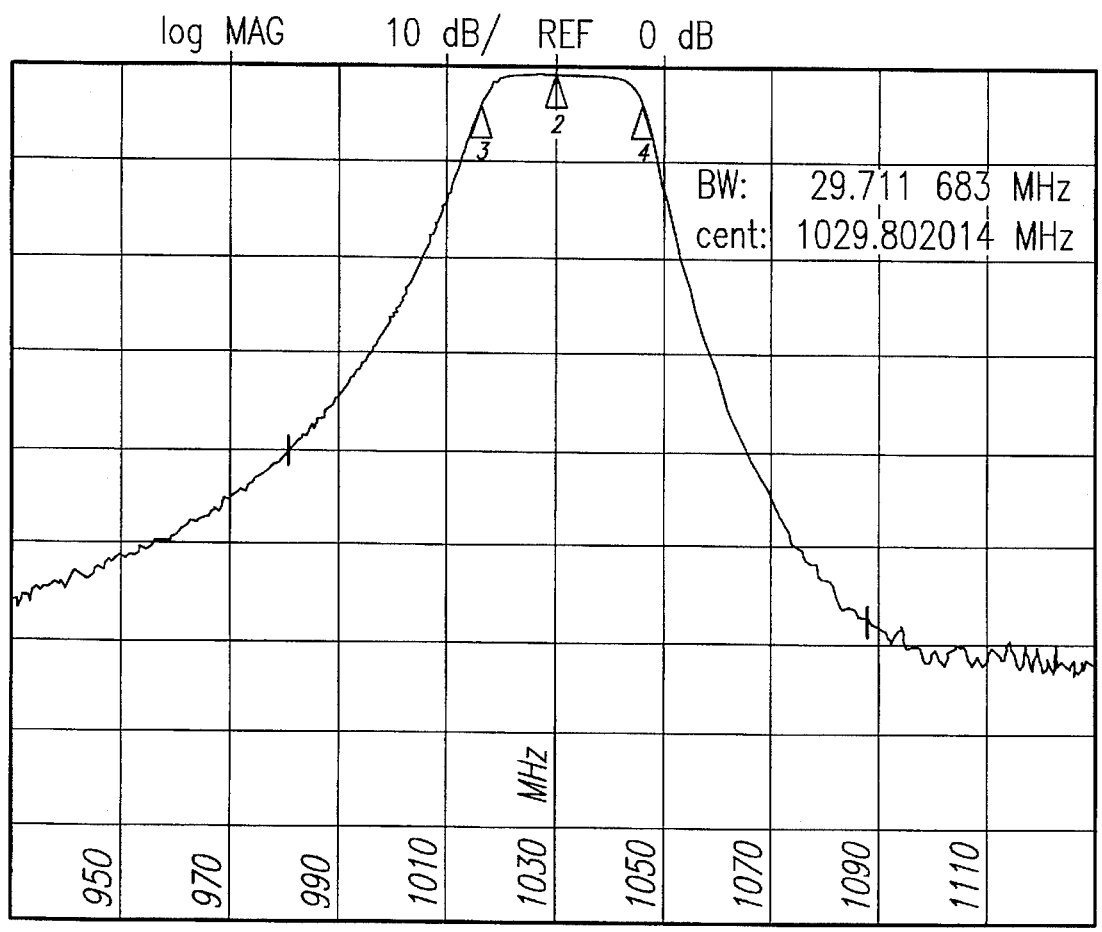
FIG. 8 is a Bode plot of the frequency response of the first IF filter according to the preferred embodiment of the present invention.

Further details of the first mixer 50 are shown in FIG. 4E along with further details of the first IF filter 52 and IF amplifier 54 connected between the first and second mixer as illustrated. For purposes of spur elimination, as will be described in detail, the first IF filter preferably has a bandwidth of approximately 30 MHz centered at 1030 MHz, with a relatively flat response from 1025 MHz to 1040 MHz, as illustrated in FIG. 8, whereby switching between the latter two IF frequencies may be performed without affecting the measured value of the desired input signal. A suitable mixer 50 is Mini Circuits type SYM859-1. A suitable mixer 46 is Mini Circuits type RMS860. A suitable mixer 48 is Avantek type IAM81008, an active mixer. Motorola type 1030D37293 is employed for filter 52, while filter 66 is preferably a type KAF-46NR-ME available from Aviex/Kyocera.

In SLM mode, the receiver is tunable from 5 to 1000 MHz in steps as small as 50 kHz, under control of the first local oscillator which is tunable from 1045 to 2040 MHz. The first IF frequency is nominally 1040 MHz, although that frequency can be varied as will be described, and the second IF frequency is fixed at 47 MHz. The second local oscillator is tunable either to 978 MHz or 1087 MHz, as will be described in further detail.

The input frequency range for leakage detection is 107–158 MHz, and, correspondingly, the second local oscillator is tuned from 154–205 MHz during leakage detection mode. The second local oscillator is capable of tuning in 12.5 kHz steps. The leakage detector input is from either the internal antenna described above with reference to FIGS. 2A and 2B or from an external antenna 56 of the AVM type. In either case, the leakage detector input from the antenna is supplied first to a varactor-tuned filter 58, an RF amplifier 60 and a 30 dB attenuator 62 as shown in FIG. 3 and illustrated in further detail in FIG. 4F. The output of the 30 dB attenuator is connected to mixer 48, which is an active mixer the output of which is combined with that from second mixer 46 in a diode network 64, as shown in FIG. 4E, which is in turn connected to the second IF filter 66 and IF amplifier 68 as shown in FIG. 3 and shown in further detail in FIG. 4E. The RF circuitry described above with reference to FIGS. 3 and 4 is preferably fabricated on a single circuit board.

Figure 5A:
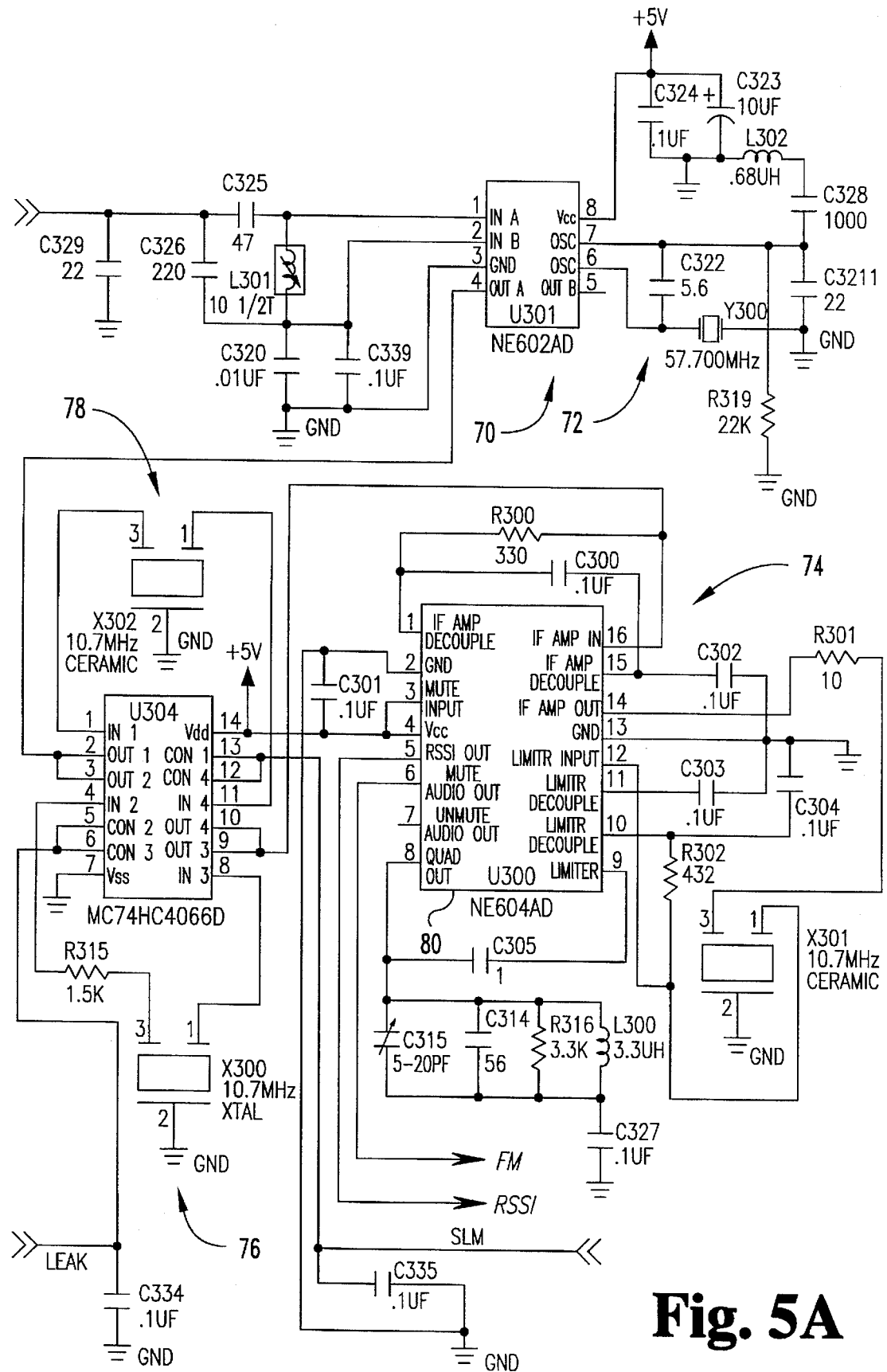
FIGS. 5A and 5B are electrical schematics for portions of the IF circuitry for the meter of FIG. 1.

The IF output of FIG. 4E is connected to the input of the third mixer 70 shown in FIG. 3 and in further detail in FIG. 5A. The third mixer is an active mixer, preferably Signetics type NE602AD, having an oscillator input from a third local oscillator 72 which operates at 57.7 MHz in the preferred embodiment. The third mixer provides a third IF signal at a nominal frequency of 10.7 MHz to the audio detector 74, which has a 10 kHz bandwidth filter 76 for leakage detection and a 280 kHz bandwidth filter 78 for signal level meter functions. Filter selection is controlled by microcontroller 30.

Figure 5B:
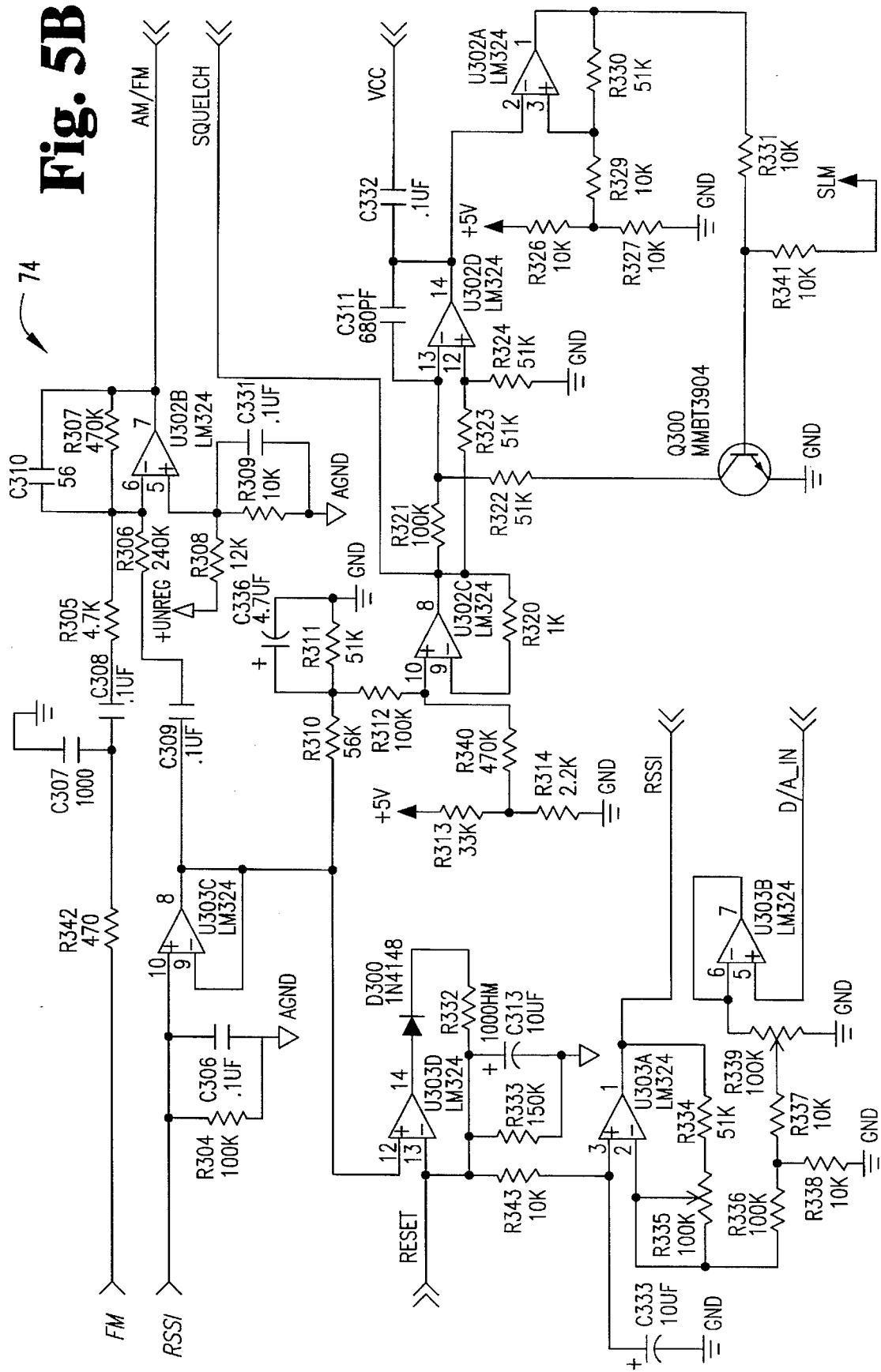

The audio detector includes a detector IC 80, Signetics type NE604AD or SA604AD, as well as output amplifier circuitry including U302B, U302C and U303C along with associated passive components as shown in FIG. 5B. The amplifiers are preferably LM324 op amps, commercially available from Motorola. The detector IC has an audio output (FM) and an RF level output (RSSI) as indicated in FIGS. 5A and 5B. The RSSI output is coupled to a peak detector (U303D) before it is supplied to the microcontroller, for purposes of measuring peak video level. A reference voltage is supplied from the D/A converter to U303D to establish an offset for the peak detector. A 5 volt level has been found suitable for such purposes. One output of the audio detector, designated AM/FM in FIG. 5B, is provided to a volume digital pot 82, and another output is provided to an audio VCO 84 the output of which (designated VCO in FIG. 5B) is connected to the volume digital pot. The audio detector also provides a SQUELCH signal output to an A/D converter 86 as shown in FIG. 3. The digital pot is preferably a two-channel pot, Dallas Semiconductor type DS1267S-010. The outputs of the pot are summed together and supplied to an audio amplifier 88 and speaker 90, as shown in FIG. 3. The A/D converter, which provides an input to the microcontroller as shown FIG. 3, is a five-channel, 10-bit A/D converter, Motorola MC145053D, and receives five inputs: RSSI (FIG. 5B), internal temperature, external temperature, SQUELCH, and battery sense.

The microcontroller provides a volume control signal to the digital pot, and also supplies tuning control signals to IF switches and to a power switch circuit, as will be described, in addition to data and control signals provided to the LCD display. There are two LCD displays, the left LCD 12a having three and a half digits, a polarity sign (+/−), a decimal point and a low battery indicator, the right LCD 12b having four digits and one decimal point. Both displays have backlighting 92 which is activated with the ON/OFF switch in HOLD mode, as defined below, and the displays are driven by a single LCD driver 94, type MSM5265GS-K commercially available from OKI Semiconductor. The left LCD is preferably used for display of signal level and function number, and the right LCD is preferably used for frequency and channel and related information. In SLM mode, the level of the RF signal is displayed numerically, and in leakage mode the leakage level is displayed in the form of a series of six vertical bars on the left LCD, with the level corresponding to the number of visible bars. The system includes a PEAK HOLD feature in the bar graph display. In addition to the visual indication, the leakage level is also indicated by an audible signal which increases in frequency as the level increases.

Figure 7:
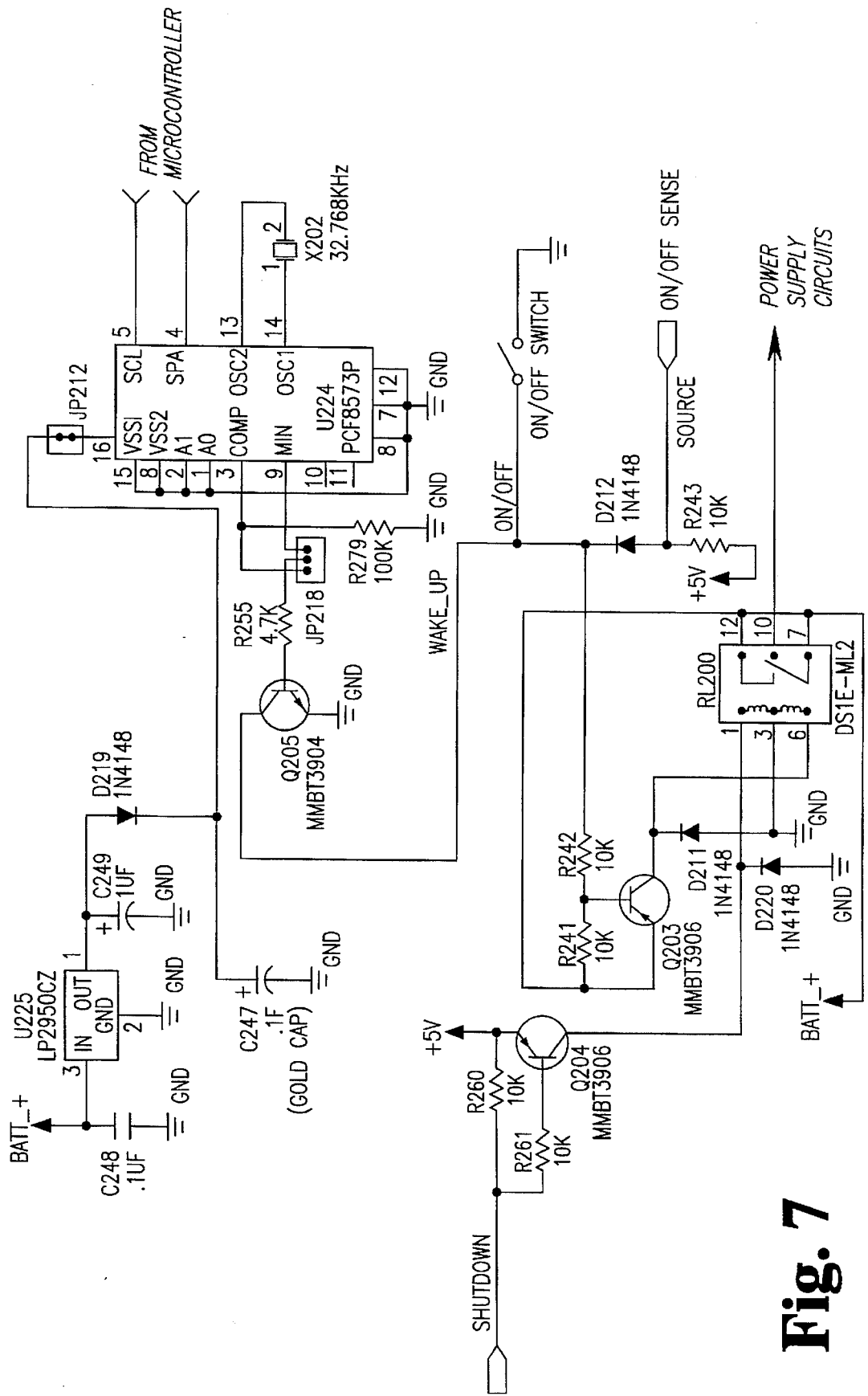
FIG. 7 is an electrical schematic of a power switch, including a time of day clock circuit, for control of the meter of FIG. 1.

The microcontroller is built around an 8-bit microcontroller IC, Motorola type MC68HC05EOFN, and also includes a 32K×8 EEPROM memory (Samsung KM28C256) and a 64K×8 EPROM (National Semiconductor NM27C512) along with associated memory address decoding logic as well as a 6-bit D/A converter, two serially driven output drivers and an RS232 output (with associated level translator). The D/A converter is preferably a Motorola MC144111D, while Allegro UCN5824A and UCN5895A devices are used as the output drivers. The RS232 output enables transfer of data collected during data logging to an external device such as a personal computer. The EEPROM is used for storage of data collected during data logging and has sufficient memory to store the level of all system carriers at up to 24 sites. L-band and H-band enable/disable signals are supplied to the band switching circuits of FIGS. 4A and 4B through the output drivers, which are also employed to supply the SLM and LEAK control signals to the signal sources of FIGS. 4C and 4D and the LEAK ATTEN control signal to the attenuator of FIG. 4F. The LEAK signal is also supplied to the audio detector as shown in FIG. 5A. The output driver circuitry is also employed to supply a reset signal to peak detector circuitry as shown in FIG. 5B. The output driver circuitry also supplies a shutdown signal to the power switch which, as shown in FIG. 7, receives inputs from the front panel ON/OFF switch as well as from a time-of-day (TOD) clock to be described in further detail. The output driver circuitry is also employed to set the attenuation level in the RF front-end attenuator.

Figure 4F:
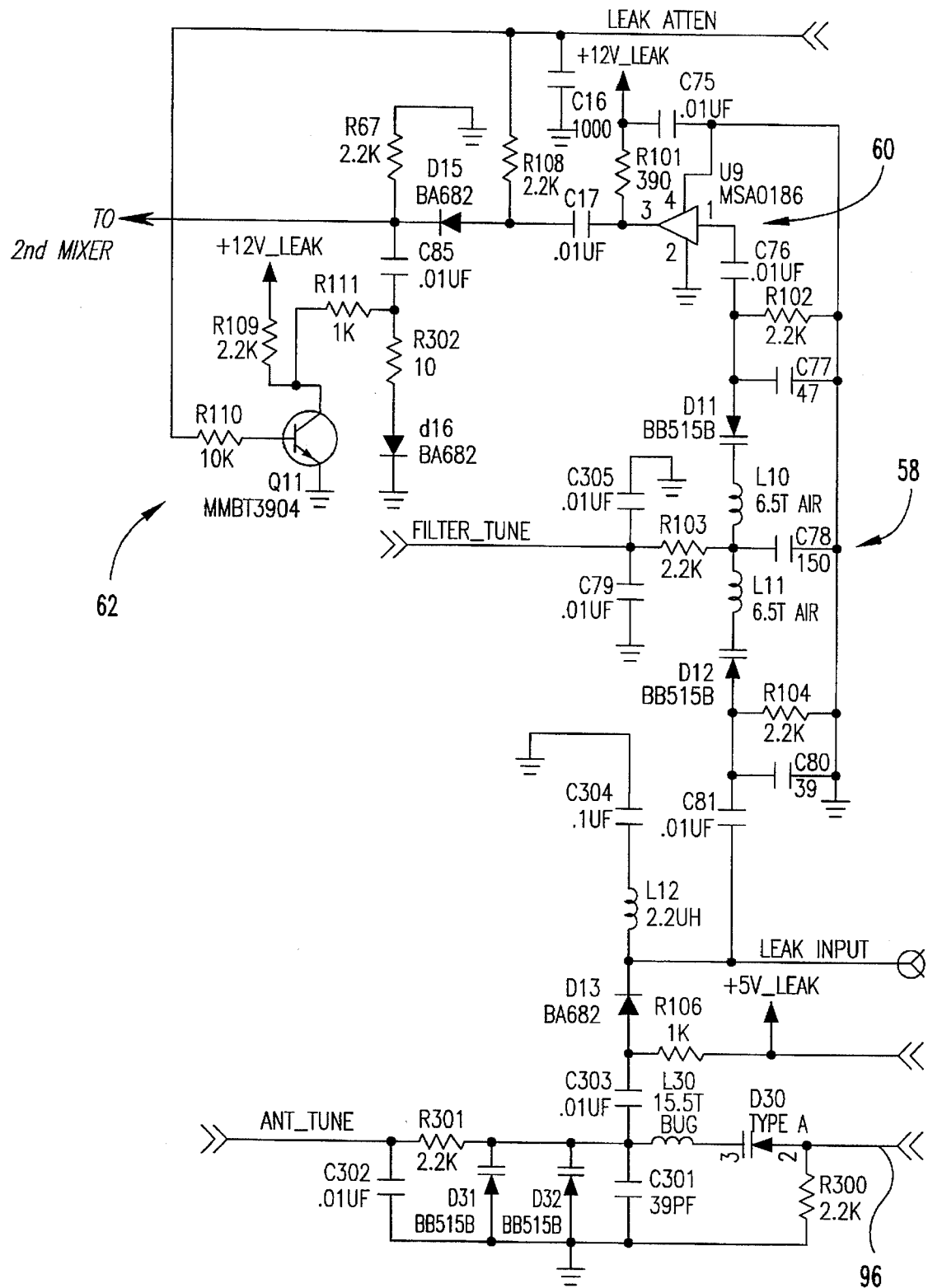

The FILTER TUNE and ANTENNA TUNE (ANT TUNE) signals are supplied from the D/A converter to the control inputs shown in FIG. 4F. The internal antenna is connected to line 96 in the antenna tuning network, and the external antenna is connected to the LEAK INPUT line.

One aspect of the present invention relates to elimination of receiver spurs by proper selection of the second local oscillator frequency and compensating the first local oscillator frequency appropriately in order to avoid significant mixing products. Selectively switching the second local oscillator frequency and the first IF frequency as the receiver is tuned will keep spurs from reaching both the second and third IF stages. This is accomplished by calculating what first and second local oscillator frequency combinations will cause spurs and then ensuring that the first IF and/or second local oscillator frequencies are switched so that these frequency combinations do not occur while providing continuous tuning of the receiver. Since no spurs are produced, the cost for extra packaging, shielding, and filtering to reduce or eliminate spurs is not needed.

The following examples will illustrate the process of spur elimination according to the preferred embodiment of the present invention.

EXAMPLE 1

Spurs will occur at the third IF frequency (10.7 MHz) when the following equation is satisfied:

$$nf_{LO1} = mf_{LO2} \pm f_{IF1} \quad (1)$$

where n and m are integers (oscillator harmonic number).

For the disclosed SLM receiver, a spur is generated from the fifth harmonic of the first local oscillator (n=5) and the sixth harmonic of the second local oscillator (m=6) when the second local oscillator is at 1087 MHz and the first local oscillator is at the frequency calculated from Equation 1 as follows:

$$5f_{LO1} = 6(1087) + 1040$$

$$f_{LO1} = 1512.4 \text{ MHz}$$

which corresponds to a receive frequency of 472.4 MHz.

This spur cannot be eliminated by changing only the second local oscillator frequency from high-side injection to low-side injection, i.e., from 1087 MHz to 993 MHz, because the second harmonics of the first and second local oscillators combine to form a frequency which is within the first IF filter bandwidth, as the following equation shows:

$$2(1512.4) = 2(993) + f_{IF1}$$

or $$f_{IF1} = 1038.8 \text{ MHz}$$

which is within the bandwidth of the first IF filter and therefore passes through to the second mixer. When converted in the second mixer, i.e., $$1038.8 - 993 = 45.8 \text{ MHz}$$

the spur is within the second IF filter bandwidth (47±1.5 MHz). Thus, with the first local oscillator tuned to receive 472.4 MHz, a spur occurs in the third IF with high-side injection or low-side injection in the second mixer.

However, the spur can be eliminated by changing the second local oscillator from 993 MHz to 978 MHz and by changing the first IF to 1025 MHz (by likewise decreasing the first local oscillator frequency by 15 MHz, to 1497.4 MHz):

$$2(1497.4) = 2(978) + f_{IF1}$$

or $$f_{IF1} = 1038.8 \text{ MHz}$$

Converting through the second mixer, 1038.8−978=60.8 MHz, which is well outside the second IF bandwidth and thereby could not cause a problem in the second or third IF stages. Thus, with a combination of IF frequency shifting and a change from high-side injection to low-side injection, the spur is avoided. In this case, IF shifting avoids a problem which cannot be solved by merely changing between high-side and low-side injection.

The first-mentioned spur in this example ($f_{RF}$=472.4 MHz resulting from $f_{LO1}$=1512.4 MHz and $f_{LO2}$=1087 MHz with 1040 MHz IF) can also be avoided by IF shifting alone. More specifically, if the first and second local oscillator frequencies were both decreased by 15 MHz, i.e., to 1497.4 MHz and 1072 MHz, respectively, the closest spur to $f_{RF}$=472.4 MHz will be at 466.4 MHz, resulting from the fifth harmonic of the first local oscillator (1491.4 MHz)

mixing with the sixth harmonic of the second local oscillator in the first mixer. Those harmonics do not cause a spur when the receiver is tuned to 472.4 MHz, as Equation 1 shows:

$$5(1497.4)=6(1072)+f_{IF1}$$

or $$f_{IF1}=1055 \text{ MHz}$$

This frequency passes through the first IF filter to some degree (approximately 10 dB down), but, after conversion in the second mixer, with the second local oscillator at 1072 MHz, the mixer output is at 17 MHz, which is well outside the second IF filter bandwidth.

Thus, shifting the IF frequency is sufficient to avoid a spur in this example, whereas switching from high-side injection to low-side injection does not avoid the spur by itself. This example also illustrates that IF shifting can eliminate spurs during high-side injection or low-side injection. In the preferred embodiment, shifting to the 1025 MHz IF is performed only during low-side injection. That is, the second local oscillator is set to one of two frequencies during SLM mode: 978 MHz, which corresponds to low-side injection combined with the low end of the IF frequency range, and 1087 MHz, which corresponds to high-side injection combined with the high end of the IF frequency range.

EXAMPLE 2

When the first IF is at 1040 MHz and the second local oscillator is at 1087 MHz, a spur is generated from the first harmonic of the first local oscillator and the second harmonic of the second local oscillator when the receiver is tuned to 94 MHz ($f_{LO1}$=1134 MHz). According to Equation 1:

$$1(1134)=2(1087)-f_{IF1}$$

$$f_{IF1}=1040 \text{ MHz}$$

which, of course, will pass through the IF stages.

If the first IF frequency is changed from 1040 MHz to 1025 MHz, and the local oscillator frequencies are likewise decreased (by 15 MHz) to keep the receiver tuned to 94 MHz, there will still be a spur generated from the first harmonic of the first local oscillator and the second harmonic of the second local oscillator because Equation 1 remains satisfied:

$$1(1119)=2(1072)-1025$$

Thus, changing only the IF frequency is not sufficient when the unit is tuned to 94 MHz.

However, with the IF frequency at 1040 MHz as at the beginning of this example, switching from high-side to low-side injection avoids the spur, as will now be described. Under these circumstances ($f_{IF1}$=1040 MHz and $f_{LO2}$=993 MHz) the closest spur to 94 MHz occurs when n=m=7. That spur occurs at a receive frequency of 101.5714 MHz, as can be calculated by those skilled in the art from the above teachings. For that combination of harmonics when the receiver is tuned to 94 MHz, Equation 1 reduces to the following:

$$7(1134)=7(993)+f_{IF1}$$

Therefore, $$f_{IF1}=987 \text{ MHz}$$

which is 53 MHz below the first IF frequency of 1040 MHz and easily rejected by the first IF filter (approximately 35 dB down). Thus, Example 2 shows that switching between high-side injection and low-side injection can avoid spurs that IF shifting cannot.

Selection of the appropriate local oscillator frequencies to avoid spurs is performed by the microcontroller according to a lookup table containing a frequency selection indication for each local oscillator for each 1 MHz increment in the input frequency range. The frequency selection indication in each case is preferably a single bit indicative of whether the first local oscillator should be set for the 1025 MHz or 1040 MHz first IF frequency, and whether the second local oscillator should be set to 978 MHz or 1087 MHz.

Figure 6:
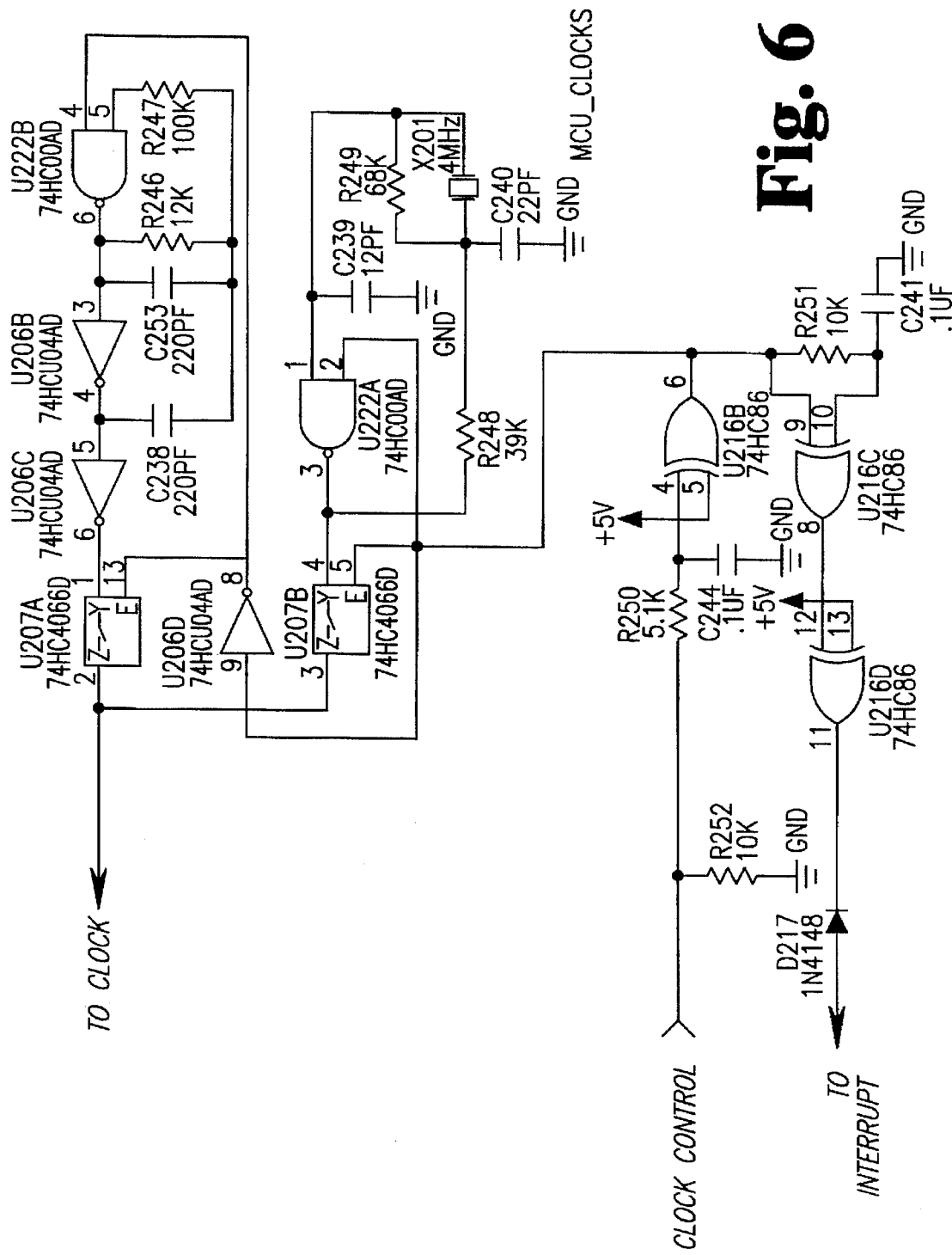
FIG. 6 is an electrical schematic for the dual clock circuit in the microcomputer of FIG. 3.

Another aspect of the present invention relates to the problem of RF interference affecting leakage measurements. The built-in antenna used for leakage detection is by necessity very close physically to the microprocessor circuitry, which generates significant RFI in the 107 to 158 MHz frequency range in which the receiver is tuned during leakage mode. This has the effect of reducing the leakage receiver's sensitivity. It has been discovered that low frequency clocking during leakage mode only reduces the spectrum of RF interference without making the unit sluggish during operation as a signal level meter. 4 MHz is the preferred fast clock frequency for use in SLM mode, and approximately 125 kHz is the preferred slow clock frequency for use in leakage mode. Referring to FIG. 6, the microcontroller supplies a control signal on the CLOCK CONTROL line through R250 to one input of U216B, which controls the state of two analog switches U207A and U207B and thereby determines which of two clock circuit outputs are supplied to the clock input of the microcontroller. The microcontroller switches between SLM mode and leakage mode each time the SLM/LEAK button is pressed, and when it switches mode it supplies a corresponding control signal on the CLOCK CONTROL line and then switches itself into its internal sleep mode. With the propagation delay introduced by R250 and C244, the microcontroller is asleep by the time the switching of its clock source occurs. In response to the change of state of U216B, an interrupt signal is generated at the output of U216D which wakes up the microcontroller, whereby it resumes operation at the new clock speed. In an alternative embodiment, the propagation delay is approximately one microsecond.

In addition to the internal sleep mode of the microcontroller, one embodiment of the invention particularly suited for data logging includes a system sleep mode during which the power switch, shown in FIG. 7, disconnects the battery from all power supply circuits (e.g., 5 V, 12 V and 24 V) in the system, thereby turning off all the analog and digital circuitry in the system except the power switch itself, which is continually provided with power from the battery. U224 in FIG. 7 is a time-of-day clock IC which wakes up the system through Q205, Q203 and relay RL200, along with the associated circuitry shown in the drawing, at a time set by the microcontroller and supplied to U224 on the lines indicated. The microcontroller is programmed to send an alarm time to U224 and then send a SHUTDOWN signal to the power switch to turn off system power. This feature enables the meter to perform the FCC-required 24-hour level variation test with the power from the meter battery alone, i.e., without AC power. The type of data collected and stored during such a test includes signal level and corresponding time of day as supplied to the TOD clock, and may also include ambient temperature readings taken at user set intervals. The data are stored in EEPROM memory, as indicated above. The power switch also serves as an interface between the ON/OFF switch and the microcontroller, whereby, when the ON/OFF switch is turned off, the power switch generates an ON/OFF SENSE signal which the microcontroller interprets as a request to shut down. In response, the microcontroller executes a shutdown procedure and then sends a SHUTDOWN signal to the power switch which performs the actual shutdown. U224 is preferably a type PCF8573P, while RL200 is preferably an Aromat DS1E-ML2 latching relay.

The spin knob is a 24-position rotary encoder with an integral SPST pushbutton switch, one type of which is commercially available from Clarostat. The spin knob has a direct electrical connection to the microcontroller, and is also connected to the microcontroller interrupt line through an exclusive-OR logic circuit arranged to generate an interrupt pulse whenever the spin knob is rotated in either direction. The microcontroller is programmed to respond to the spin knob inputs for tuning (in frequency or channel mode), for function selection, for memory selection, and for volume control. Any one of a number of available functions are selectable in MENU mode, which the microcontroller is programmed to enter in response to NORMAL mode operation of the function (FUNC) button, while in SLM mode. The microcontroller is programmed to respond to two modes of operation of several front panel controls, including the ON/OFF and function switches as well as the spin knob, according to the duration for which the switch is pressed, as set forth below:

| Mode | Duration |
| --- | --- |
| NORMAL | less than 2 seconds |
| HOLD | more than 2 seconds |

Upon entering the MENU mode, the system is programmed to display F1, the first of up to 99 sequentially arranged functions which can be selected by rotating the spin knob until the desired function number is displayed in the left LCD and then pressing the spin knob button less than 2 seconds (NORMAL mode). The function number display increases, with high-to-low wraparound, during clockwise rotation of the spin knob and decreases, with low-to-high wraparound during counterclockwise rotation of the spin knob.

The system is also provided with a "cloning" capability, i.e., the ability to make one meter, referred to as a slave, become identical in its operating configuration to a second meter, referred to as the master. This cloning procedure is accomplished by copying the contents of selected memory locations of the master to the slave. The data is transferred from the master to the slave via RS-232 ports in both meters. A remote mode and remote address are provided in each meter, and, for the cloning procedure, both meters are set to the same remote address and the slave is put into the remote mode, using designated functions for those purposes. The meters are also capable of data transmission at multiple serial bit rates, and the bit rates are set to the same value using a designated function. The cloning process is then started by selecting a special function designated for that purpose, after which an audible display is generated when the cloning process is complete.

Another feature of the preferred embodiment is the capability of storing customer calibration data in addition to factory calibration data. The function menu is provided with one function selection for selection of the customer calibration data and another function selection for selection of the factory calibration data. The system also provides for major and minor customer calibrations. The minor calibration provides a fixed offset which is applied to every signal level measurement.

Figure 10B:
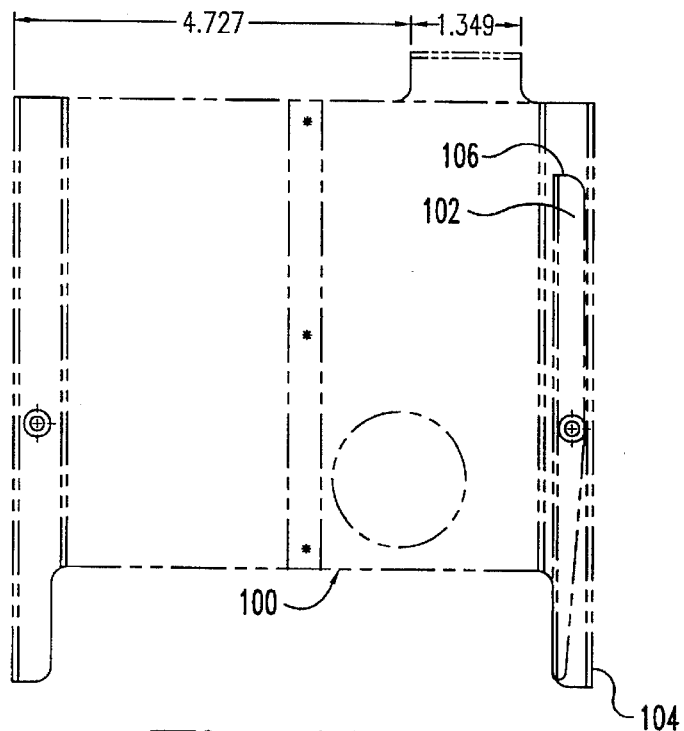
FIGS. 10A, B and C are front, top and side views, respectively, of the metal bracket illustrated in FIG. 9.
Figure 10C:
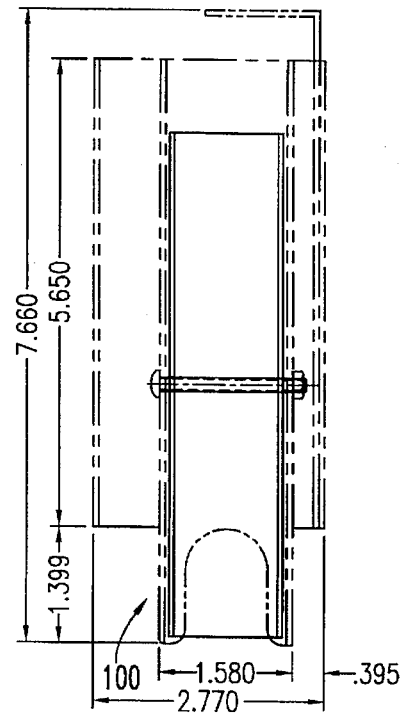
Figure 10A:
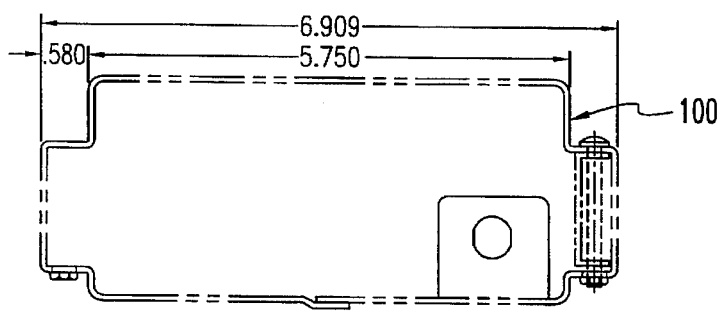

Referring now to FIGS. 9 and 10, another aspect of the present invention is a snap-in bag including a metal bracket or mount 100 adapted to receive the meter case 24. The bracket is provided with a latch plate 102 which is pivotably mounted as shown with the forward end spring biased toward the outside 104 of the bracket. The bracket is preferably constructed of anodized aluminum coated with nylon, which reduces scratching during insertion and removal of the meter. The right side of the meter case is provided with a block or tab (not shown) positioned sufficiently near the rear end thereof so as to clear the rear end 106 of the latch plate just prior to the meter reaching its full insertion depth into the bracket. When the tab clears the rear end of the latch plate, which is pivoted slightly against the spring force during insertion, the rear end of the latch plate snaps inwardly into a position to lock the meter in place. Removal of the meter from the bracket is accomplished simply by inward pressure on the forward end of the latch plate combined with an outward pulling force on the meter. The bracket is preferably contained in a soft bag 108 which may be fabricated from vinyl or fabric.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

I claim:

1. A multiple conversion receiver system, comprising:
    first and second local oscillators;
    first conversion means coupled to an RF input and to said first local oscillator for producing a first IF signal within a predetermined first IF band;
    second conversion means coupled to said first conversion means and to said second local oscillator for producing a second IF signal; and
    control means for avoiding receiver spurs by combined switching of multiple local oscillator frequencies, said control means including
        A) means for selecting an alternative frequency for said first IF signal within the predetermined IF band and for correspondingly changing the frequencies of said first and second local oscillators; and
        B) means for switching the frequency of said second local oscillator between a low-side injection frequency and a high-side injection frequency,
        wherein said control means further includes lookup table means for storing a frequency selection indication for each of said first and second local oscillators based on the desired input frequency, including an indication of first IF frequency for said first local oscillator and an indication of first IF frequency and injection frequency for said second local oscillator.

2. The multiple conversion receiver system of claim 1, wherein said first conversion means includes a bandpass filter with a relatively flat response across said predetermined first IF band.

3. The multiple conversion receiver system of claim 1, wherein said second conversion means includes a fixed second IF frequency, further comprising a fixed third local oscillator and third conversion means coupled to said second conversion means and to said third local oscillator for producing a third IF signal.

4. A multiple conversion receiver system, comprising:

first and second local oscillators;

first conversion means coupled to an RF input and to said first local oscillator for producing a first IF signal within a predetermined first IF band;

second conversion means coupled to said first conversion means and to said second local oscillator for producing a second IF signal; and control means for avoiding receiver spurs by combined switching of multiple local oscillator frequencies, said control means including A) means for selecting an alternative frequency for said first IF signal within the predetermined IF band and for correspondingly changing the frequencies of said first and second local oscillators; and B) means for switching the frequency of said second local oscillator between a low-side injection frequency and a high-side injection frequency, wherein said control means includes means for limiting said second local oscillator to two frequencies, one corresponding to low-side injection combined with one first IF frequency, and the other corresponding to high-side injection combined with said alternative first IF frequency.

5. The multiple conversion receiver system of claim 4, wherein said control means further includes lookup table means for storing a frequency selection indication for each of said first and second local oscillators based on the desired input frequency, including an indication of first IF frequency for said first local oscillator and an indication of first IF frequency and injection frequency for said second local oscillator.

6. The multiple conversion receiver system of claim 5, wherein said frequency selection indications each correspond to a plurality of desired input frequencies.

7. The multiple conversion receiver system of claim 6, wherein said first conversion means includes a bandpass filter with a relatively flat response across said predetermined first IF band.

8. The multiple conversion receiver system of claim 7, wherein said second conversion means includes a fixed second IF frequency, further comprising a fixed third local oscillator and third conversion means coupled to said second conversion means and to said third local oscillator for producing a third IF signal.

9. A multiple conversion receiver system, comprising:

first and second local oscillators;

first and second mixers coupled to said first and second local oscillators, respectively;

a first IF filter coupled between said first and second mixers, said first IF filter having a defined IF band;

a control circuit having frequency control output lines connected to said first and second local oscillators, said control circuit having stored frequency control codes for said first and second local oscillators for a plurality of input frequencies, the frequency control codes for said first and second local oscillators including codes corresponding to first and second alternative first IF frequencies within said defined IF band, the frequency control codes for said second local oscillator including codes corresponding to high-side and low-side injection frequencies, wherein said frequency control codes for said first and second local oscillators each include a frequency selection indication stored in a lookup table including an indication of first IF frequency for said first local oscillator and an indication of first IF frequency and injection frequency for said second local oscillator.

10. The multiple conversion receiver system of claim 9, wherein said first IF filter is a bandpass filter with a relatively flat response across said defined IF band.

11. The multiple conversion receiver system of claim 9, further comprising a second IF filter with a narrow bandwidth, a fixed-frequency third local oscillator, and a third mixer coupled to said second IF filter and to said third local oscillator.

12. A multiple conversion receiver system, comprising:

first and second local oscillators;

first and second mixers coupled to said first and second local oscillators, respectively;

a first IF filter coupled between said first and second mixers, said first IF filter having a defined IF band;

a control circuit having frequency control output lines connected to said first and second local oscillators, said control circuit having stored frequency control codes for said first and second local oscillators for a plurality of input frequencies, the frequency control codes for said first and second local oscillators including codes corresponding to first and second alternative first IF frequencies within said defined IF band, the frequency control codes for said second local oscillator including codes corresponding to high-side and low-side injection frequencies, wherein said frequency control codes for said second local oscillator correspond either to low-side injection combined with a first of said alternative first IF frequencies or to high-side injection combined with a second of said alternative first IF frequencies.

13. The multiple conversion receiver system of claim 12, wherein said frequency control codes for said first and second local oscillators each include a frequency selection indication stored in a lookup table including an indication of first IF frequency for said first local oscillator and an indication of first IF frequency and injection frequency for said second local oscillator.

14. The multiple conversion receiver system of claim 13, wherein said frequency selection indications each correspond to a plurality of desired input frequencies.

15. The multiple conversion receiver system of claim 14, wherein said first IF filter is a bandpass filter with a relatively flat response across said defined IF band.

16. The multiple conversion receiver system of claim 15, further comprising a second IF filter with a narrow bandwidth, a fixed-frequency third local oscillator, and a third mixer coupled to said second IF filter and to said third local oscillator.

17. A method of avoiding receiver spurs in a multiple conversion receiving, comprising the steps:

mixing an RF input signal with a first local oscillator signal to produce a first IF signal within a predetermined first IF band;

mixing said first IF signal with a second local oscillator signal to produce a second IF signal; and selectively switching the second local oscillator frequency and first IF frequency as the receiver is tuned to avoid spurs while allowing continuous tuning of the receiver, said selective switching step including, for a plurality of desired input frequencies, switching the second local oscillator frequency between a low-side injection frequency and a high-side injection frequency, wherein said selective switching step further includes the step of storing in a lookup table a frequency selection indication for each of said first and second local oscillator frequencies based on the desired input frequency, including an indication of a first IF frequency as the basis for setting the first local oscillator frequency, and an indication of a first IF frequency and an injection frequency as the basis for setting said second local oscillator frequency.

18. The method of claim 17, further comprising the step of filtering said first IF signal with a bandpass filter having a relatively flat response across said predetermined first IF band.

19. The method of claim 17, further comprising the step of mixing said second IF signal with a fixed-frequency third local oscillator signal to produce a third IF signal.

20. A method of avoiding receiver spurs in a multiple conversion receiving, comprising the steps:

mixing an RF input signal with a first local oscillator signal to produce a first IF signal within a predetermined first IF band;

mixing said first IF signal with a second local oscillator signal to produce a second IF signal; and selectively switching the second local oscillator frequency and first IF frequency as the receiver is tuned to avoid spurs while allowing continuous tuning of the receiver, said selective switching step including, for a plurality of desired input frequencies, switching the second local oscillator frequency between a low-side injection frequency and a high-side injection frequency, wherein said selective switching step includes the step of limiting said second local oscillator frequency to two frequencies, one corresponding to low-side injection combined with one first IF frequency, and the other corresponding to high-side injection combined with an alternative first IF frequency.

21. The method of claim 20, wherein said selective switching step further includes the step of storing in a lookup table a frequency selection indication for each of said first and second local oscillator frequencies based on the desired input frequency, including an indication of a first IF frequency as the basis for setting the first local oscillator frequency, and an indication of a first IF frequency and an injection frequency as the basis for setting said second local oscillator frequency.

22. The method of claim 21, wherein said frequency selection indications each correspond to a plurality of desired input frequencies.

23. The method of claim 22, further comprising the step of filtering said first IF signal with a bandpass filter having a relatively flat response across said predetermined first IF band.

24. The method of claim 23, further comprising the step of mixing said second IF signal with a fixed-frequency third local oscillator signal to produce a third IF signal.

* * * * *